(12) United States Patent
Yang et al.

(10) Patent No.: US 10,651,412 B2
(45) Date of Patent: May 12, 2020

(54) OLED DISPLAY PANEL TO REDUCE LIGHT LEAKAGE AND METHOD FOR MANUFACTURING THE SAME, AND DISPLAY DEVICE

(71) Applicant: Wuhan China Star Optoelectronics Semiconductor Display Technology Co., Ltd., Wuhan, Hubei (CN)

(72) Inventors: Jie Yang, Hubei (CN); Ming Zhang, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/575,992

(22) PCT Filed: Jul. 18, 2017

(86) PCT No.: PCT/CN2017/093248
§ 371 (c)(1),
(2) Date: Nov. 21, 2017

(87) PCT Pub. No.: WO2018/232806
PCT Pub. Date: Dec. 27, 2018

(65) Prior Publication Data
US 2018/0375052 A1     Dec. 27, 2018

(30) Foreign Application Priority Data

Jun. 21, 2017    (CN) .......................... 2017 1 0475855

(51) Int. Cl.
*H01L 51/52*     (2006.01)
*H01L 51/50*     (2006.01)
(Continued)

(52) U.S. Cl.
CPC ...... *H01L 51/5096* (2013.01); *H01L 27/3246* (2013.01); *H01L 51/5036* (2013.01);
(Continued)

(58) Field of Classification Search
CPC ... H01L 51/5096; H01L 27/3211–3218; H01L 27/3246; H01L 27/3283; H01L 27/3295
See application file for complete search history.

(56) References Cited

U.S. PATENT DOCUMENTS

2010/0164842 A1*   7/2010   Ishihara ............... H01L 27/3211
                                                                                                             345/32
2018/0151631 A1*   5/2018   Lee ..................... H01L 51/5072

FOREIGN PATENT DOCUMENTS

CN         101064335 A      10/2007
CN         105679801 A      6/2016
(Continued)

*Primary Examiner* — Shaun M Campbell
*Assistant Examiner* — Suberr L Chi
(74) *Attorney, Agent, or Firm* — Mintz Levin Cohn Ferris Glovsky and Popeo, P.C.; Steven M. Jensen (57) ABSTRACT

The present disclosure discloses an OLED display panel, including a TFT array substrate and a plurality of anodes disposed in an array on the TFT array substrate, the TFT array substrate has a pixel defining layer disposed thereon, the pixel defining layer includes opening portions and spacing portions, and each opening portion corresponds to one sub-pixel area; wherein, the pixel defining layer has a first common layer, a second common layer and a cathode layer sequentially disposed thereon, and a light emitting material is disposed between the first common layer and the second common layer corresponding to each sub-pixel area; wherein, a hole blocking portion is further disposed above the spacing portion, and the hole blocking portion spaces the first common layer between two adjacent sub-pixel areas.

(Continued)

The present disclosure further discloses a method for manufacturing the OLED display panel as mentioned above.

10 Claims, 7 Drawing Sheets

(51) Int. Cl.
*H01L 27/32* (2006.01)
*H01L 51/56* (2006.01)
*H01L 51/00* (2006.01)

(52) U.S. Cl.
CPC ...... *H01L 51/5056* (2013.01); *H01L 51/5072* (2013.01); *H01L 51/5206* (2013.01); *H01L 51/5221* (2013.01); *H01L 51/56* (2013.01); *H01L 27/3211* (2013.01); *H01L 51/0005* (2013.01); *H01L 2227/323* (2013.01); *H01L 2251/558* (2013.01)

(56) References Cited

FOREIGN PATENT DOCUMENTS

| | | |
|---|---|---|
| CN | 105895664 A | 8/2016 |
| CN | 106876331 A | 6/2017 |
| WO | 2015141142 A1 | 9/2015 |

\* cited by examiner

OLED DISPLAY PANEL TO REDUCE LIGHT LEAKAGE AND METHOD FOR MANUFACTURING THE SAME, AND DISPLAY DEVICE

CROSS-REFERENCES TO RELATED APPLICATIONS

This application is a U.S. national phase application, pursuant to 35 U.S.C. § 371, of PCT/CN2017/093248, filed Jul. 18, 2017, designating the United States, which claims priority to Chinese Application No. 201710475855.3, filed Jun. 21, 2017. The entire contents of the aforementioned patent applications are incorporated herein by this reference.

TECHNICAL FIELD

The present disclosure relates to a display technical field, in particular to an OLED display panel and a method for manufacturing the same, and also relates to a display device including the above-mentioned OLED display panel.

BACKGROUND ART

An OLED (organic electroluminescent diode) display device has characteristics, such as a self-illumination, a wide view angle, a high luminous efficiency, a low power consumption, a fast responding time, a good low temperature characteristic, a simple manufacturing process, a low cost and so on, which has been widely used in the display field.

A core component of the OLED display device is an OLED display panel, and a structure of the OLED display panel usually includes: a TFT array substrate and an anode layer, a pixel defining layer, a first common layer, a light emitting layer, a second common layer and a cathode layer sequentially manufactured on the TFT substrate. The anode layer includes a plurality of anodes arranged in an array, and the pixel defining layer includes a plurality of pixel openings corresponding to the anodes one by one; the first common layer completely covers the pixel defining layer and the anode layer (continually covering through an entire surface in the structure layer), and the first common layer may include a plurality of sub function layers; the light emitting layer includes a plurality of light emitting units corresponding to the pixel openings one by one, and the light emitting units are located in the pixel openings; the second common layer completely covers the light emitting layer and the first common layer (continually covering through an entire surface in the structure layer), and the first common layer may include a plurality of sub function layers; and the cathode layer is covered on the second common layer.

A working principle of the OLED display panel is that, under the effect of an electric field between the anode and the cathode, holes are transferred to the light emitting layer through the first common layer, electrons are transferred to the light emitting layer through the second common layer, and the holes and the electrons are combined in the light emitting layer thereby emitting light. The OLED display panel usually realizes a display effect of different colors by a mixture of R, G, B three primary colors, thus one pixel of the OLED display panel usually includes R, G, B three light emitting units, and R, G, B three light emitting units of each pixel can be separately controlled by a driving circuit. To be specific, the cathode layer of the R, G, B three light emitting units is common, and the anode layers are independent to each other, and a separate driving of each light emitting unit may be realized by controlling the anode corresponding each light emitting unit.

As the resolution of the display panel increases, the number of light emitting units per unit area also increases continuously, as a result, intervals between the light emitting units decreases continuously, in addition, in order to improve display efficiency, many excellent transport materials have been introduced to the first common layer for transferring holes. In the case where the intervals between the light emitting units decreases and the transfer performance of the first common layer increases continuously, a transverse current of the display panel also increases, which causes a crosstalk. To be specific, in the structure of the existing OLED display panel as mentioned above, since the first common layers of the adjacent light emitting units are connected, when one of the light emitting units (a target light emitting unit) is lit, a small amount of holes can be injected into the adjacent light emitting unit through the first common layer, and combined with the electrons in the adjacent light emitting unit thereby emitting light, which causes that light emitted by the target light-emitting unit is impure, this light-emitting phenomenon is called as the leaked light-emitting phenomenon, and a current formed by a small amount of leaked holes is called as a leakage current. Especially when the target light emitting unit is lit under a low current, since the light emitted by the target light emitting unit is also weak, the performance of the light leakage phenomenon is obvious at this time, and thereby the display quality of the OLED display panel is reduced.

SUMMARY

With a view to the shortcomings of the prior art, the present disclosure provides an OLED display panel and a method for manufacturing the same, and the OLED display panel may effectively eliminate the light leakage phenomenon between two adjacent sub-pixels, to improve the display quality of the OLED display panel.

In order to achieve the above purpose, the present disclosure adopts the following technical solutions:

An OLED display panel, including a TFT array substrate and a plurality of anodes disposed in an array on the TFT array substrate, wherein the TFT array substrate has a pixel defining layer disposed thereon, the pixel defining layer includes opening portions exposing the anodes and spacing portions used for spacing two adjacent anodes, and each opening portion corresponds to one sub-pixel area; wherein, the pixel defining layer has a first common layer used for transferring holes, a second common layer used for transferring electrons and a cathode layer sequentially disposed thereon, and a light emitting material is disposed between the first common layer and the second common layer corresponding to each sub-pixel area; wherein, a hole blocking portion is further disposed above the spacing portion, and the hole blocking portion spaces the first common layer between two adjacent sub-pixel areas.

A width of the hole blocking portion is not greater than a top width of the spacing portion.

A thickness of the hole blocking portion is not less than a thickness of the first common layer.

A thickness of the hole blocking portion is greater than the thickness of the first common layer.

Each sub-pixel area corresponds to a red sub-pixel, a green sub-pixel or a blue sub-pixel, respectively, the light emitting material in the red sub-pixel is a light emitting material that can emit red light, the light emitting material in the green sub-pixel is a light emitting material that can emit green light, and the light emitting material in the blue sub-pixel is a light emitting material that can emit blue light.

The present disclosure further provides a method for manufacturing an OLED display panel, including:

providing a TFT array substrate and manufacturing a plurality of anodes in an array arrangement on the TFT array substrate;

manufacturing a pixel defining layer thin film on the TFT array substrate, and etching the pixel defining layer thin film to be a pixel defining layer having an opening portion and a spacing portion;

forming the first common layer used for transferring holes through deposition on the pixel defining layer;

manufacturing the hole blocking portion above the spacing portion of the pixel defining layer, and separating the first common layer at the portion corresponding to the upper portion of the spacing portion;

forming the light emitting material through deposition on the first common layer at a position corresponding to the opening portion of the pixel defining layer;

forming the second common layer used for transferring electrons through deposition on the first common layer, and the second common layer covers the light emitting material and the first common layer; and forming the cathode layer on the second common layer through deposition.

The step for manufacturing the hole blocking portion specifically includes: preparing a hole blocking material solution; wherein, the hole blocking material solution includes a solvent and a hole blocking material dissolved in the solvent, and the solvent is volatile and can dissolve the material of the first common layer; printing the hole blocking material solution on the first common layer on the portion corresponding to the spacing portion of the pixel defining layer by using a printing process, wherein the solvent in the hole blocking material solution dissolves and separates the first common layer at the printing position; and curing the printed hole blocking material solution by using a curing process, and obtaining a hole blocking portion separating the first common layer above the spacing portion.

The hole blocking material solution is printed on the first common layer by using an inkjet printing process, and the printed hole blocking material solution is cured by using a high temperature firing process.

Compared with the prior art, the OLED display panel and the method for manufacturing the same provided in the embodiment of the present disclosure, in the OLED display panel, two adjacent sub-pixel areas have a hole blocking portion therebetween, the hole blocking portion spaces the first common layer, which is used for transferring holes, between two adjacent sub-pixel areas, which prevents the holes from leaking from each other between two adjacent sub-pixel areas, and may effectively eliminate the light leakage phenomenon between two adjacent sub-pixels, to improve the display quality of the OLED display panel.

DETAILED DESCRIPTION OF EXEMPLARY EMBODIMENTS

In order for the purpose, technical solution and advantages of the present disclosure to be clearer, the embodiments of the present disclosure will be explained in detail below in conjunction with the drawings. These preferred embodiments are exemplified in the drawings. The embodiments of the present disclosure as shown in the drawings and as described according to the drawings are only exemplified, and the present disclosure is not limited to these embodiments.

Here, it is also worthy to note that, in order to prevent the present disclosure from being obscured due to unnecessary details, the drawings only illustrate the structure and/or processing steps closely related to the solution according to the present disclosure, while other details less related to the present disclosure are omitted.

Figure 1:
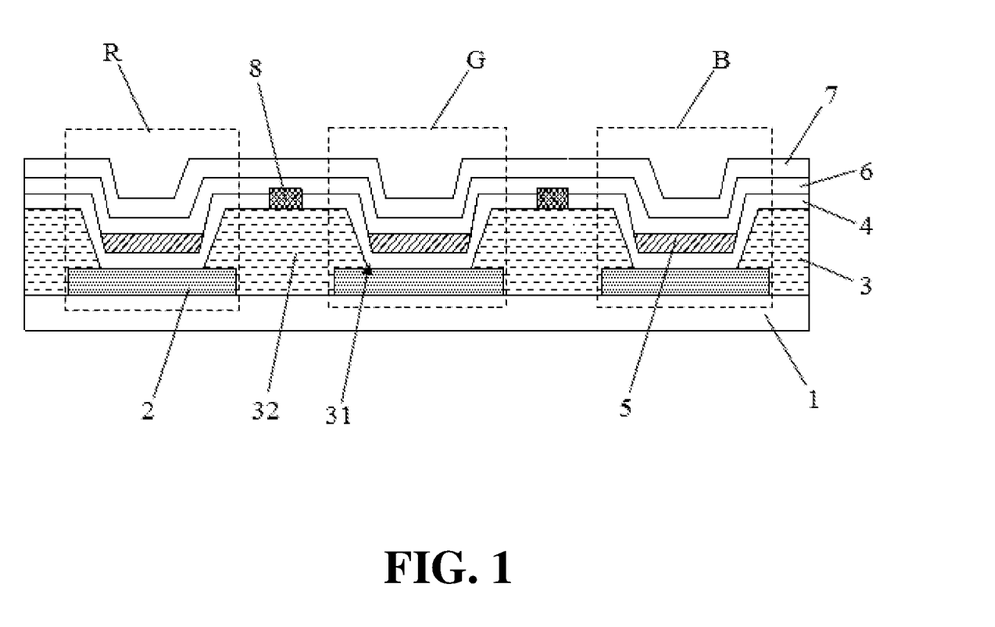
FIG. 1 is a structure diagram of an OLED display panel provided in an embodiment of the present disclosure.

The present embodiment first provide an OLED display panel, as shown in FIG. 1, the OLED display panel includes a TFT array substrate 1 and a plurality of function layers sequentially disposed on the TFT array substrate 1, these function layers includes an anode layer (including a plurality of anodes 2 disposed in an array), a pixel defining layer 3, a first common layer (Hole Transport Layer, HTL) 4 used for transferring holes, an light emitting material layer (Emissive Layer, EML, as shown in FIG. 1, including a light emitting material 5 correspondingly located above each anode 2), a second common layer (Electron Transport Layer, ETL) 6 used for transferring electrons and a cathode layer 7. The pixel defining layer 3 is covered on the TFT array substrate 1, and the pixel defining layer 3 includes opening portions 31 exposing the anodes 2 and spacing portions 32 for spacing two adjacent anodes 2, and each of the opening portions 31 corresponds to one sub-pixel area R, G, B. The first common layer 4 usually includes a hole injection layer and a hole transport layer sequentially disposed in a direction gradually away from the anode layer, and may further be disposed with an electron-blocking layer; and the second common layer 6 usually includes an electron injection layer and an electron transport layer sequentially disposed in a direction gradually away from the cathode layer 7, and may further be provided with a hole-blocking layer.

Figure 2:
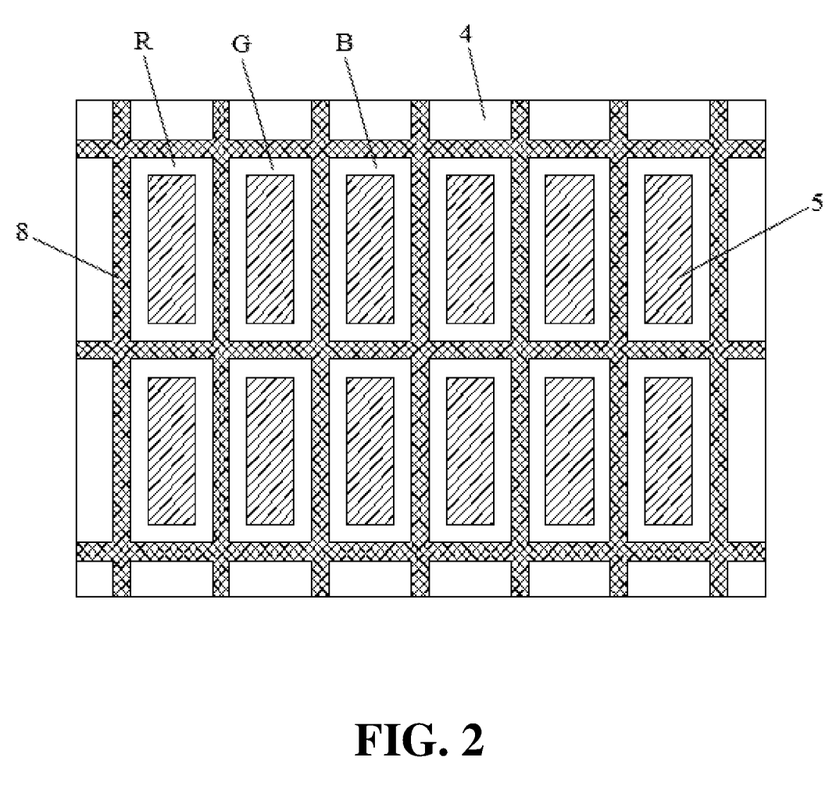
FIG. 2 is a top view structure diagram of a hole-blocking portion in an embodiment of the present disclosure.

Referring to FIGS. 1 and 2, in the present embodiment, a hole blocking portion 8 is further disposed above the spacing portions 32 of the pixel defining layer 3, and the hole blocking portion 8 spaces the first common layer 4 between two adjacent sub-pixel areas. To be specific, the hole blocking portion 8 is manufactured by the hole-blocking material (Hole-blocking layer, HBL), which can block the holes from traversing the area, that is, the hole blocking portion 8 spaces the first common layer between two adjacent sub-pixel areas, which prevents the holes from leaking from each other between two adjacent sub-pixel areas, and may effectively eliminate the light leakage phenomenon between two adjacent sub-pixels, to improve the display quality of the OLED display panel.

Referring to FIG. 1, a width of the hole blocking portion 8 should not be greater than a top width of the spacing portion 32. A thickness of the hole blocking portion 8 should not be less than a thickness of the first common layer 4. In a preferred technical solution, as shown in FIG. 1, the thickness of the hole blocking portion 8 is greater than the thickness of the first common layer 4, that is, the top end of the hole blocking portion 8 protrudes from the upper surface of the first common layer 4.

To be specific, in the OLED display panel, as shown in FIG. 1, each sub-pixel area corresponds to a red sub-pixel R, a green sub-pixel G or a blue sub-pixel B, respectively, and the sequentially arranged red sub-pixel R, the green sub-pixel G and the blue sub-pixel B constitute one pixel unit. The light emitting material 5 in the red sub-pixel R is a light emitting material that can emit red light, the light emitting material 5 in the green sub-pixel G is a light emitting material that can emit green light, and the light emitting material 5 in the blue sub-pixel B is a light emitting material that can emit blue light. Each pixel unit realizes a display effect of different colors by a mixture of R, G, B three primary colors emitted by the red sub-pixel R, the green sub-pixel G, and the blue sub-pixel B.

The light emitting material 5 mainly uses an electroluminescent material, which emits light under an electrodynamic excitation condition, and is usually a fluorescent material or a phosphorescent material.

Figure 3A:
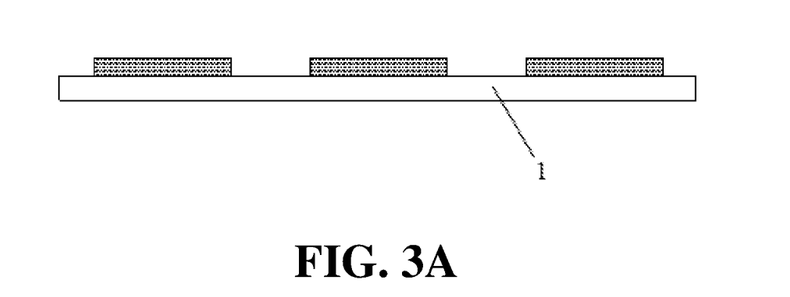
FIGS. 3A-3H are exemplary diagrams of a device structure manufactured through respective steps in a method for manufacturing an OLED display panel provided in an embodiment of the present disclosure.

Hereinafter, the method for manufacturing the above-described OLED display panel is further explained with reference to FIGS. 3A-3H, comprising:

S1, referring to FIG. 3A, providing a TFT array substrate 1 and manufacturing a plurality of anodes 2 in an array arrangement on the TFT array substrate 1.

Figure 3B:
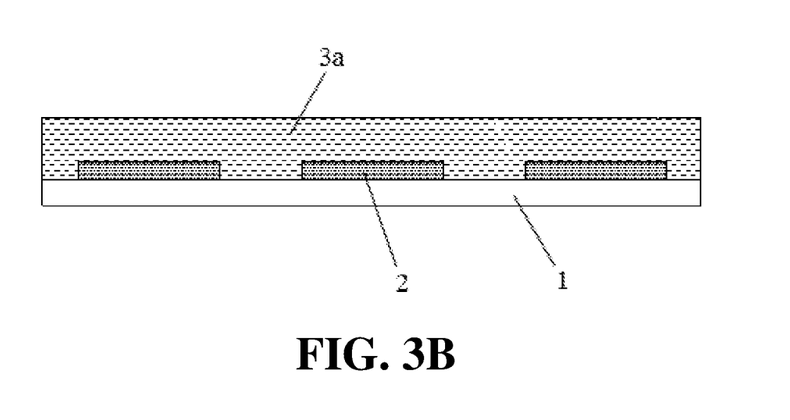

S2, referring to FIG. 3B, manufacturing a pixel defining layer thin film 3a on the TFT array substrate 1. The pixel defining layer thin film 3a continuously covers the TFT array substrate 1 and the plurality of anodes 2 on the TFT array substrate 1. The pixel defining layer thin film 3a is manufactured by using a non-conducting material, which may be a non-conducting organic material or an inorganic material.

Figure 3C:
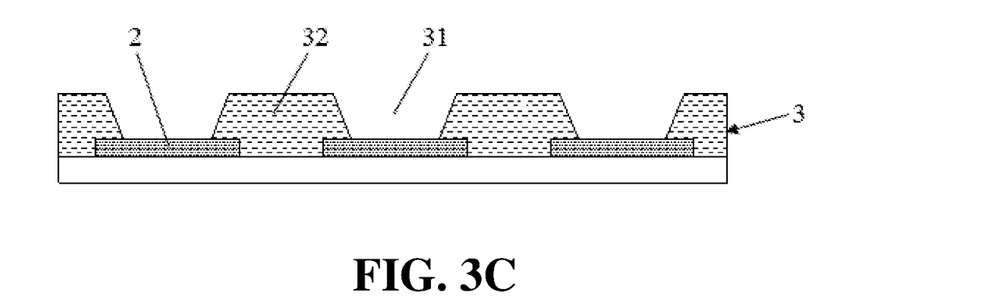

S3, referring to FIG. 3C, etching the pixel defining layer thin film 3a to be a pixel defining layer 3 having an opening portion 31 and a spacing portion 32 by using an etch process. One opening portion 31 is disposed corresponding to each anode 2, and the anode 2 is exposed from the opening portion 31; and the spacing portion 32 is used for spacing two adjacent anodes 2.

Figure 3D:
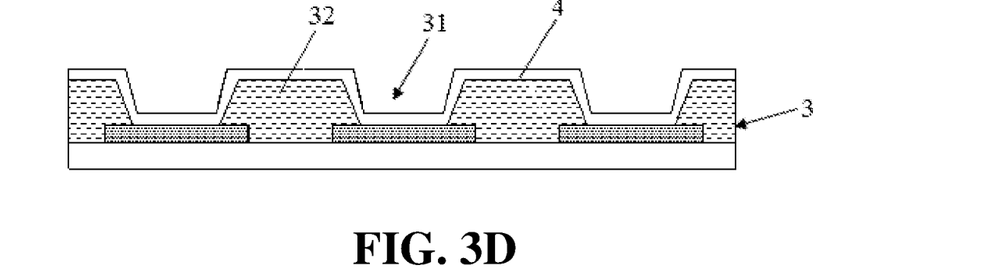

S4, referring to FIG. 3D, forming the first common layer 4 used for transferring holes through deposition on the pixel defining layer 3 by using an evaporation process. The first common layer 4 is covered on the opening portion 31 and the spacing portion 32 of the pixel defining layer 3.

Figure 3E:
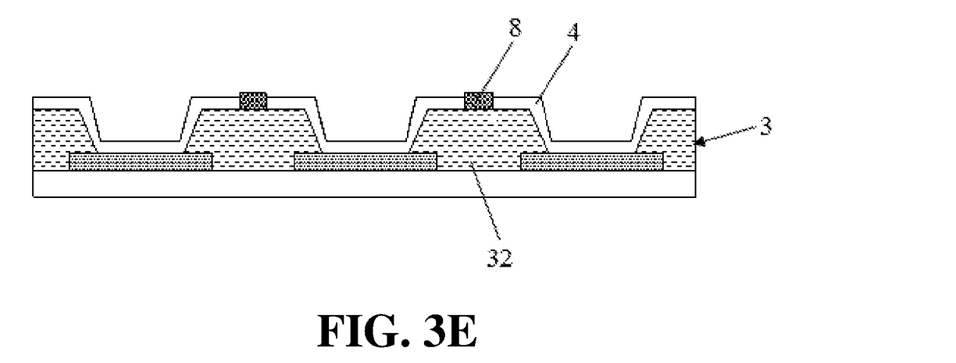

S5, referring to FIG. 3E, manufacturing the hole blocking portion 8 above the spacing portion 32 of the pixel defining layer 3, and separating the first common layer 4 at the portion corresponding to the upper portion of the spacing portion 32. The step specifically includes:

S51, preparing a hole blocking material solution. The hole blocking material solution includes a solvent and a hole blocking material dissolved in the solvent. Preferably, the hole blocking material solution should not contain water, and may not react with the material of the first common layer 4 to produce water and oxygen. The solvent is volatile and can dissolve the material of the first common layer 4, which preferably uses tetrahydrofuran. Generally, a thickness of the first common layer 4 is relatively small, and it only needs a small amount of solvent to dissolve and separate the first common layer 4, thus, in the hole blocking material solution, a concentration of the hole blocking material may be prepared as high as possible.

S52, printing the hole blocking material solution on the first common layer 4 on the portion corresponding to the spacing portion 32 of the pixel defining layer 3 by using a printing process, wherein the solvent in the hole blocking material solution dissolves and separates the first common layer 4 at the printing position. It is preferable to print the hole blocking material solution on the first common layer 4 by using inkjet printing process.

S53, curing the printed hole blocking material solution by using a curing process, and obtaining a hole blocking portion 8 separating the first common layer 4 above the spacing portion 32. It is preferable to cure the printed hole blocking material solution by using a high temperature firing process.

Figure 3F:
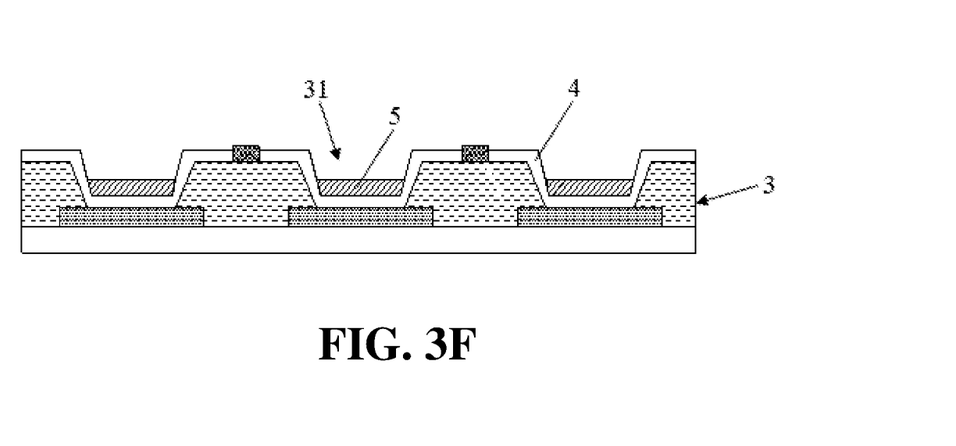

S6, referring to FIG. 3F, forming the light emitting material 5 through deposition on the first common layer 4 at a position corresponding to the opening portion 31 of the pixel defining layer 3 by using the evaporation process.

Figure 3G:
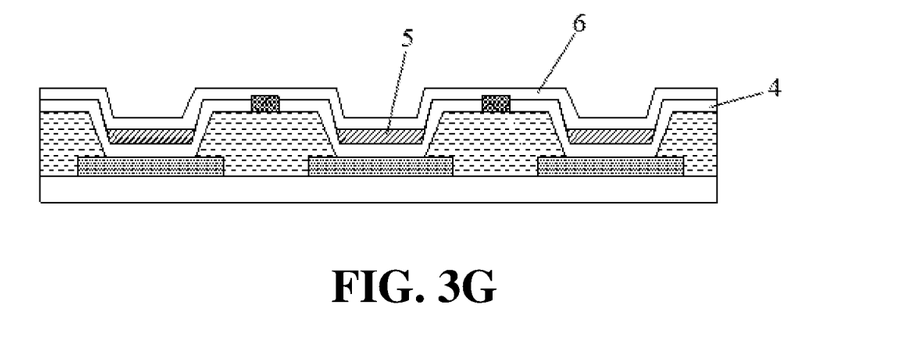

S7, referring to FIG. 3G, forming the second common layer 6 used for transferring electrons through deposition on the first common layer 4 by using the evaporation process, wherein the second common layer 6 covers the light emitting material 5 and the first common layer 4.

Figure 3H:
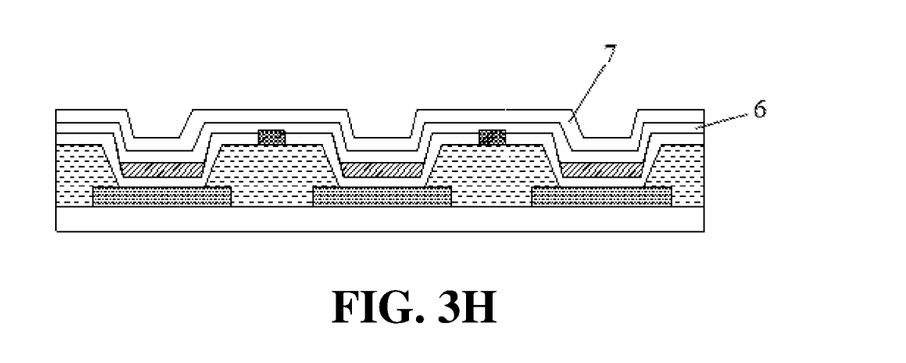

S8, referring to FIG. 3H, forming the cathode layer 7 on the second common layer 6 through deposition by using the evaporation process, and finally obtaining the OLED display panel.

Figure 4:
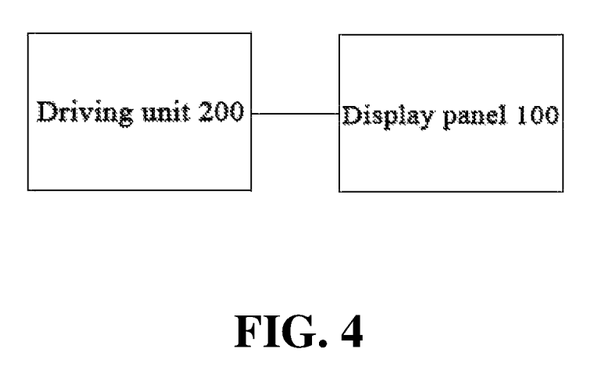
FIG. 4 is a structure diagram of a display device provided in an embodiment of the present disclosure.

The present embodiment further provides a display device, as shown in FIG. 4, the display device includes a driving unit 200 and a display panel 100, and the driving unit 200 provides a driving signal to the display panel 100 to make the display panel 100 display an image. The display panel 100 adopts the OLED display panel provided in the above embodiment of the present disclosure.

In summary, as for the OLED display panel and the method for manufacturing the same provided in the above embodiment, in the OLED display panel, two adjacent sub-pixel areas have a hole blocking portion therebetween, the hole blocking portion spaces the first common layer, which is used for transferring holes, between two adjacent sub-pixel areas, which prevents the holes from leaking from each other between two adjacent sub-pixel areas, and may effectively eliminate the light leakage phenomenon between two adjacent sub-pixels, to improve the display quality of the OLED display panel.

It should be explained that the relationship terms, such as first and second, etc., in the present text are only used for distinguishing one entity or operation from another entity or operation without requiring or implying any actual relation or sequence existing between these entities or operations. Moreover, the term "include", "contain" or any other variant means covering instead of exclusively including, so that the process, method, object or device including a series of factors not only includes those factors but also includes other factors that are not explicitly listed or further include inherent factors for this process, method, object or device. Where no more limitations are provided, the factors defined by the sentence "include one . . . " do not exclude additional identical factors existing in the process, method, object or device which includes the factors.

The above statements are only the specific embodiments of the present application, it should be pointed out that, to those ordinary skilled in the art, several improvements and polish can be made without breaking away from the principle of the present application, also those improvements and polish should be considered as the protection scope of the present application.

What is claimed is:

1. An OLED display panel, comprising:
a TFT array substrate;
a plurality of anodes disposed in an array on the TFT array substrate;
a pixel defining layer disposed on the TFT array substrate, wherein the pixel defining layer comprises a plurality of opening portions exposing the anodes and a plurality of spacing portions, wherein each spacing portion of the plurality of spacing portions is formed between two adjacent anodes, and each opening portion of the plurality of opening portions corresponds to one sub-pixel area;
a first common layer for transferring holes, a second common layer for transferring electrons and a cathode layer sequentially disposed on the pixel defining layer;
a light emitting material disposed between the first common layer and the second common layer, wherein the light emitting material is disposed to correspond to each sub-pixel area; and
a hole blocking portion disposed directly on a spacing portion of the plurality of spacing portions of the pixel defining layer to divide the first common layer between two adjacent sub-pixel areas.

2. The OLED display panel of claim 1, wherein a width of the hole blocking portion is not greater than a top width of the spacing portion.

3. The OLED display panel of claim 1, wherein a thickness of the hole blocking portion is not less than a thickness of the first common layer.

4. The OLED display panel of claim 1, wherein a thickness of the hole blocking portion is greater than the thickness of the first common layer.

5. The OLED display panel of claim 1, wherein each sub-pixel area corresponds to a red sub-pixel, a green sub-pixel or a blue sub-pixel, respectively, the light emitting material in the red sub-pixel is a light emitting material that can emit red light, the light emitting material in the green sub-pixel is a light emitting material that can emit green light, and the light emitting material in the blue sub-pixel is a light emitting material that can emit blue light.

6. A display apparatus, comprising a driving unit and an OLED display panel, wherein the driving unit provides a driving signal to the OLED display panel to make the OLED display panel display an image, and the OLED display panel comprises:
a TFT array substrate;
a plurality of anodes disposed in an array on the TFT array substrate;
a pixel defining layer disposed on the TFT array substrate, wherein the pixel defining layer comprises a plurality of opening portions exposing the anodes and a plurality of spacing portions, wherein each spacing portion of the plurality of spacing portions is formed between two adjacent anodes, and each opening portion of the plurality of opening portions corresponds to one sub-pixel area;
a first common layer for transferring holes, a second common layer for transferring electrons and a cathode layer sequentially disposed on the pixel defining layer;
a light emitting material disposed between the first common layer and the second common layer, wherein the light emitting material is disposed to correspond to each sub-pixel area; and
a hole blocking portion disposed directly on a spacing portion of the plurality of spacing portions of the pixel defining layer to divide the first common layer between two adjacent sub-pixel areas.

7. The display device of claim 6, wherein a width of the hole blocking portion is not greater than a top width of the spacing portion.

8. The display device of claim 6, wherein a thickness of the hole blocking portion is not less than a thickness of the first common layer.

9. The display device of claim 6, wherein a thickness of the hole blocking portion is greater than the thickness of the first common layer.

10. The display device of claim 6, wherein each sub-pixel area corresponds to a red sub-pixel, a green sub-pixel or a blue sub-pixel, respectively, the light emitting material in the red sub-pixel is a light emitting material that can emit red light, the light emitting material in the green sub-pixel is a light emitting material that can emit green light, and the light emitting material in the blue sub-pixel is a light emitting material that can emit blue light.

* * * * *